United States Patent [19]
Fang et al.

[11] Patent Number: 6,033,985
[45] Date of Patent: Mar. 7, 2000

[54] CONTACT PROCESS INTERCONNECT POLY-CRYSTAL SILICON LAYER IN THIN FILM SRAM

[75] Inventors: Yean-Kuen Fang, Tainan; Kuo-Ching Huang, Kaohsiung; Chung-Yao Chen, Chang Hua, all of Taiwan

[73] Assignee: National Science Council of Republic of China, Taiwan

[21] Appl. No.: 09/102,374

[22] Filed: Jun. 30, 1998

[51] Int. Cl.[7] ................................................ H01L 21/8234
[52] U.S. Cl. ........................ 438/649; 438/149; 438/238; 438/381; 438/382; 438/241; 438/153; 438/683; 438/630
[58] Field of Search ..................................... 438/649, 149, 438/238, 381, 382, 152–153, 241, 682–683, 630

[56] References Cited

U.S. PATENT DOCUMENTS

| | | |
|---|---|---|
| 5,329,486 | 7/1994 | Lage ......................................... 365/145 |
| 5,408,130 | 4/1995 | Woo et al. ................................ 257/758 |
| 5,668,391 | 9/1997 | Kim et al. ................................. 257/328 |
| 5,824,579 | 10/1998 | Subramanian et al. .................. 438/238 |
| 5,895,961 | 4/1999 | Chen ......................................... 257/382 |
| 5,937,291 | 8/1999 | Tsai et al. ................................. 438/238 |

*Primary Examiner*—Charles Bowers
*Assistant Examiner*—Thanh Nguyen
*Attorney, Agent, or Firm*—Birch, Stewart, Kolasch & Birch, LLP

[57] ABSTRACT

A contact process interconnects poly-crystal silicon layer, and more particularly, this process dramatically decreases the voltage drop within a poly-crystal silicon layer. The advantages of the process include not only improvement in the interface quality of Poly-Si/SiO2 to decrease the junction damage but also do not increase its process complexity and its mask number during the fabrication of poly-crystal silicon thin-film SRAM to meet high integration requirement in VLSI.

6 Claims, 6 Drawing Sheets

CONTACT PROCESS INTERCONNECT POLY-CRYSTAL SILICON LAYER IN THIN FILM SRAM

BACKGROUND OF THE INVENTION

1. Field Of The Invention

The present invention relates to a new contact process interconnect poly-crystal silicon layer, and more particularly, to a process that could reduce dramatically the voltage drop between poly-crystal silicon layer. Their advantages include not only to improve the interface quality of Poly-Si/SiO2 but also do not increase its process complexity and its mask number during the fabrication of poly-crystal silicon thin-film SRAM.

2. Description Of The Prior Art

The structure of poly-crystal silicon thin-film SRAM (as shown in FIG. 1) includes character-line signal (11) and bit-line signal (12). Two junctions of N1, N2 (the contact between poly-crystal silicon layer) are mainly used to connect the Access Transistor Q1,Q2, Driving Transistor Q3,Q4 ,the TFT load Q5, Q6 and the gate of another transistor set. This junction quality will directly influence the whole characteristics of SRAM cell.

The conventional contact process interconnect poly-crystal silicon layer as shown in FIG. 2. After the deposition of the gate 21 (Poly3) of poly-crystal silicon, its upper side will be deposited by a dioxide layer 22 then by a 800° C. high-temperature process to make this dioxide layer 22 more uniform, as shown in FIG. 2A. After that, defining a contact window 23 from the gate of poly-crystal silicon, as shown in FIG. 2B and FIG. 2C. Next, the thin-film channel layer 24 (Poly4) of poly-crystal silicon will again be deposited as shown in FIG. 2D. Finally, the ion implantation of channel layer and source 241, drain 242 occurs, as shown in FIG. 2E. By way of contact window 23, the poly3 and poly4 will link together and form a contact between poly-crystal silicon layer.

This conventional method has some inevitable drawbacks. First, considering the contact section of poly-crystal silicon layer, a PN junction diode is formed due to poly3 is N+, poly4 is P+. When decreasing the device size or lowering its operation voltage, the voltage drop ratio of junction diode will increase and that would deteriorate the device characteristics. Secondly, it is necessary to remove the photo-resist when define the contact window for its gate layer is covered by a dioxide layer. Therefore, the interface of Poly-Si/SiO2 will have more interface states which adversely effect device characteristics such as larger leakage current (Ioff), shift of threshold voltage (Vt-shift), decreasing of subthreshold swing, etc.

Based on the above description, the junction voltage drop ratio will be more obvious by this conventional method when decrease the device size or operation voltage, so the device characteristics deteriorate more seriously. Besides, the leakage current will be a major consideration when the IC with more integrated circuits. This conventional method have more interface states so that increase more leakage current means more power consumption and therefore the power dissipation is more difficult.

SUMMARY OF THE INVENTION

It is therefore a primary objective of the present invention is to provide a process which could overcome the above drawbacks by the Ti—Si contact technology that could meet the future demands on low operating voltage and high integration IC. Thus, compare to conventional technology, this invention not only could avoid the PN junction diode but also does not need to add more mask numbers, and also could improve the Poly-Si/SiO2 junction quality and lessen interface states.

The conventional technology to fabricate the contact between poly-crystal silicon layer includes silicon growth, definition of the gate on poly-crystal silicon then going on the deposition of dioxide layer and define the contact window; next is to deposit the channel layer, finally is going on the ion implantation of channel layer and source, drain.

This invention includes a new process to overcome the problems of conventional process. Its advantage is to overcome not only the difficulty of conventional process, but also to not increase additional process complexity. Thus, the application product of this new technology has better market competition capability.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

Please refer to FIG. 3 which relates to the process procedures of the present invention. The new contact technology of the present invention is applied to the loading transistor of poly-crystal silicon layer in thin film SRAM, the other access transistor or drive transistor also use same process.

Those process procedures is as follows:

(1). First, going on 5000A field dioxide layer on N-type substrate (3~4 ohm).

(2). Going on poly-crystal silicon thin-film layer growth 500A~1000A to the dioxide layer by deposition.

(3). By way of ion implantation technology to obtain PH3 (1E 14~1E 16/cm2), and define the gate of N+ poly-crystal silicon (Poly3).

(4). To deposit a 200A~500A gate dioxide layer 32 by LPCVD under 750° C.~950 ° C., then by high temperature process to make the dioxide layer 32 more densification.

Figure 1:
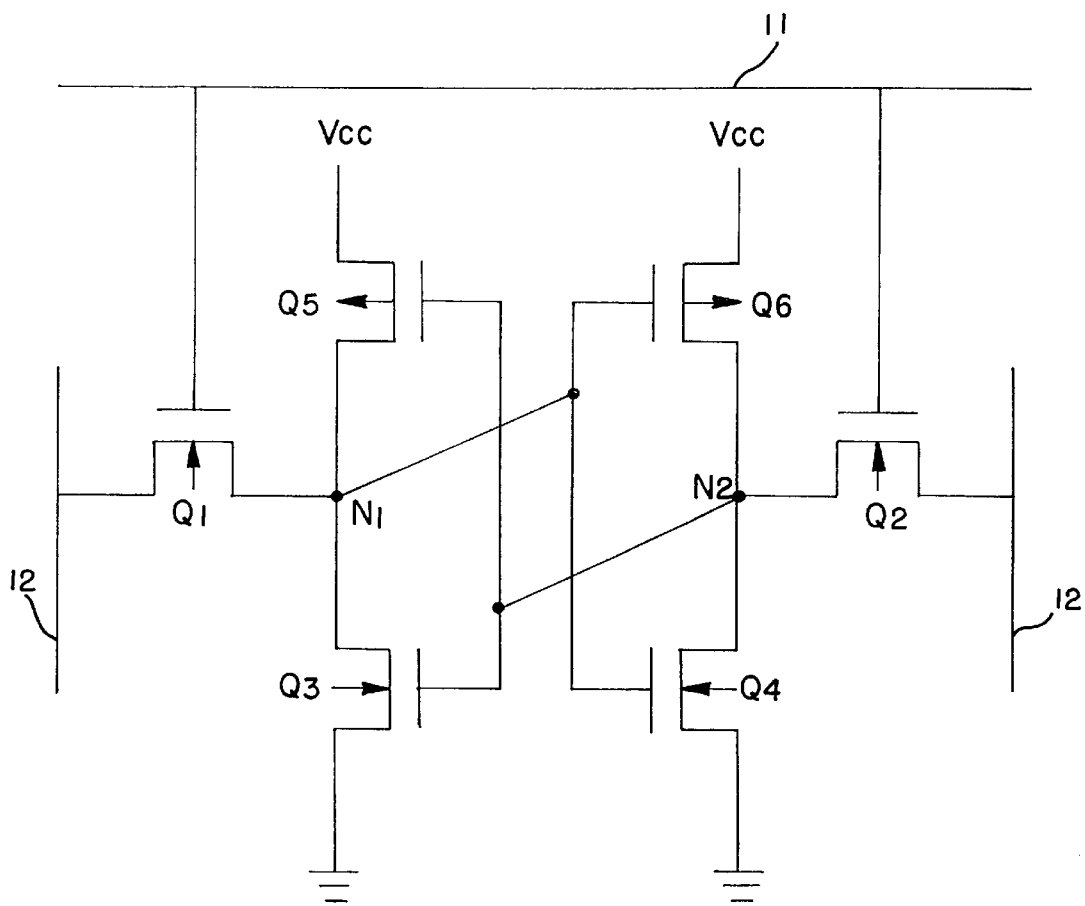
FIG. 1 is one cell circuit diagram of poly-crystal silicon thin-film transistor SRAM.
Figure 2A:
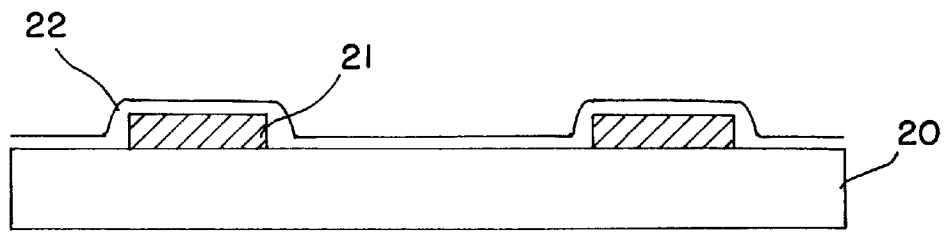
FIGS. 2A,2B,2C,2D and 2E show the process procedures relating to conventional process interconnect poly-crystal silicon layer of thin-film transistor.
Figure 2B:
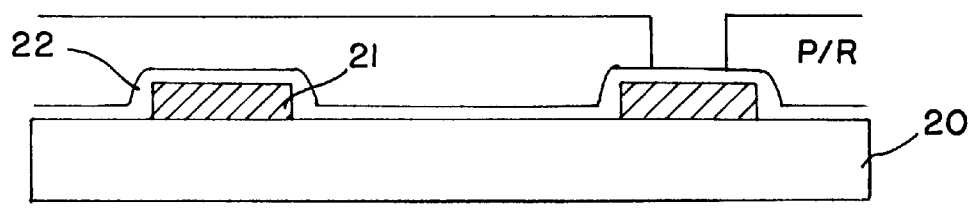
Figure 2C:
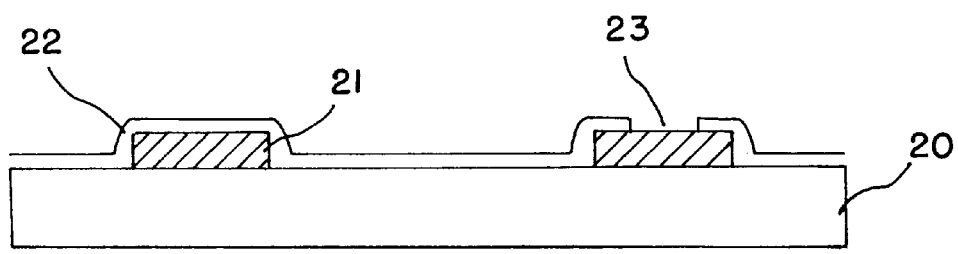
Figure 2D:
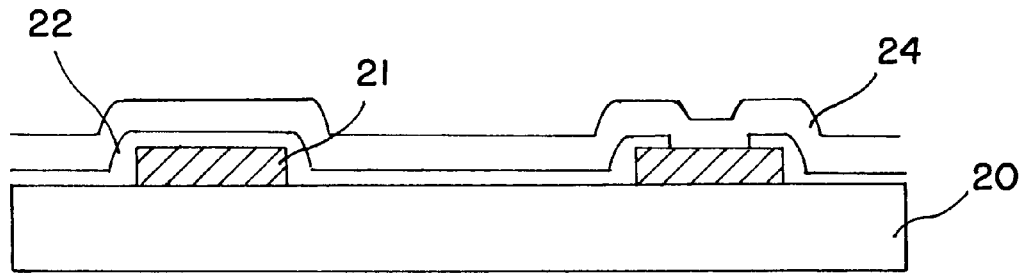
Figure 2E:
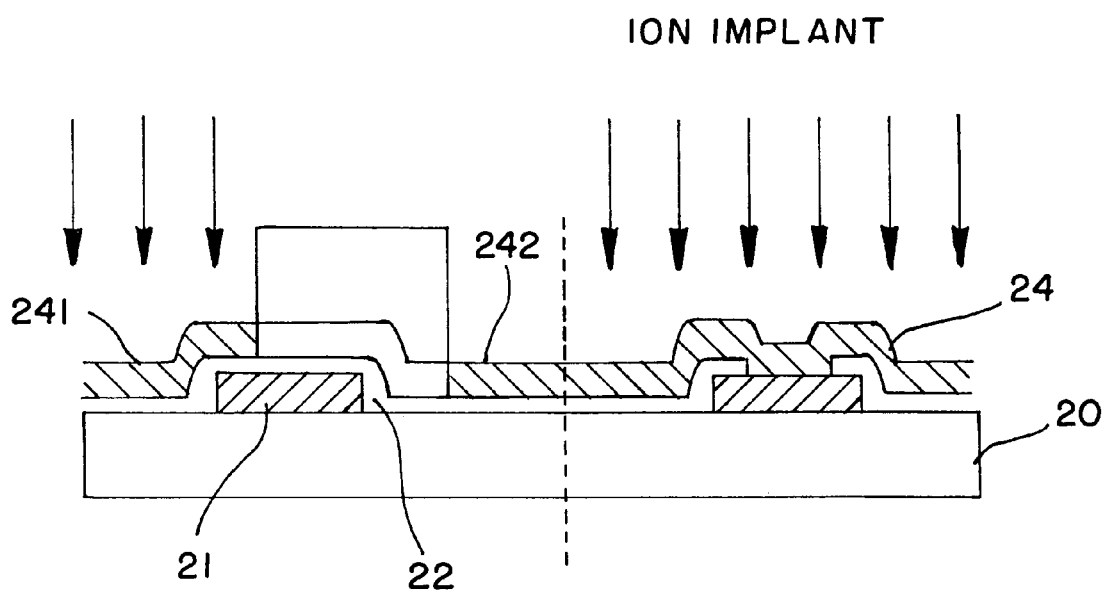
Figure 3A:
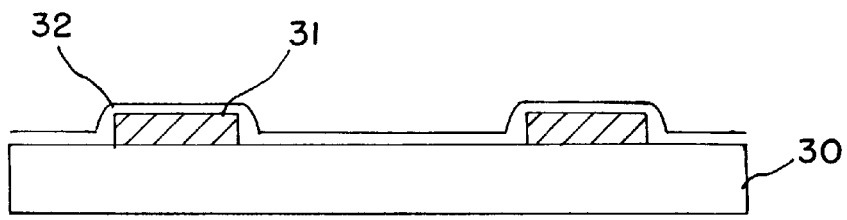
FIGS. 3A,3B,3C,3D,3E,3F,3G and 3H show the process procedures relating to the Ti—Si contact technology that interconnect poly-crystal silicon layer of thin-film transistor of the present invention.
Figure 3B:
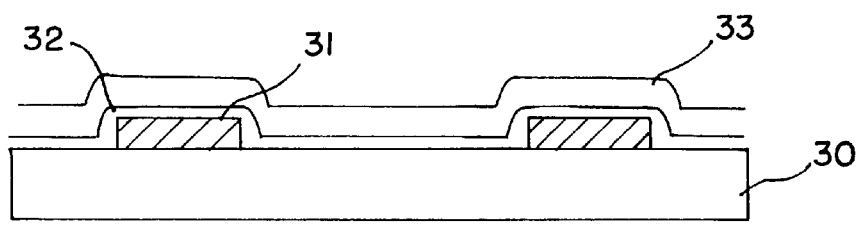

(procedure (1)~(4) are shown in FIG. 3A)

(5). To deposit a 300A amorphous silicon thin-film layer 32 by LPCVD under 400° C.~600° C., then by a high temperature process (500° C.~650° C.), annealing by nitrogen-oxide for 24 hr to make amorphous into poly-crystal, i.e. to form the poly-crystal silicon channel layer 33. Again, by ion implantation technology to implant the boron or phosphorus ion (1E 12~1E 13/cm2). (please refer to FIG. 3B)

Figure 3C:
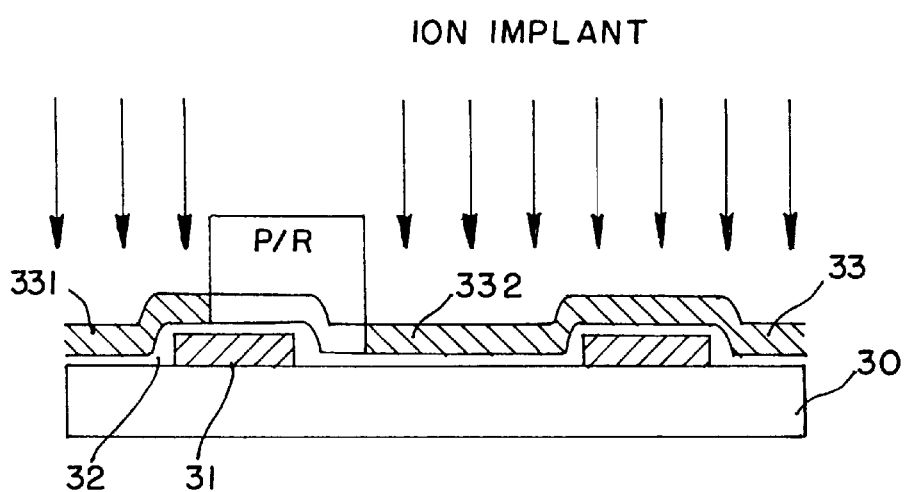
Figure 3D:
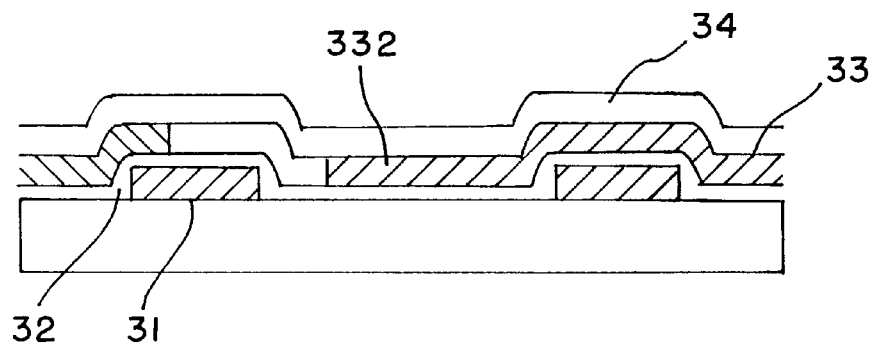
Figure 3E:
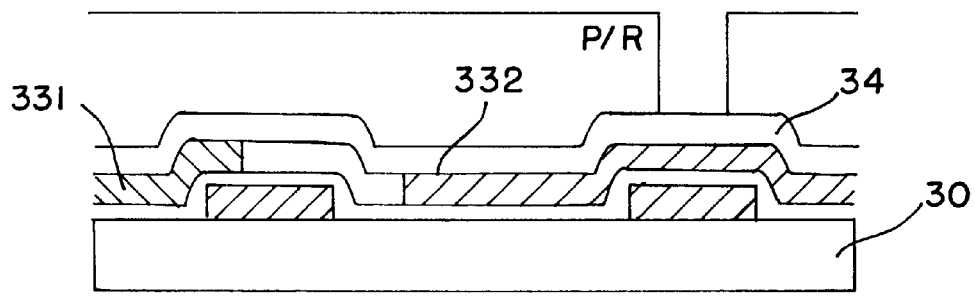
Figure 3F:
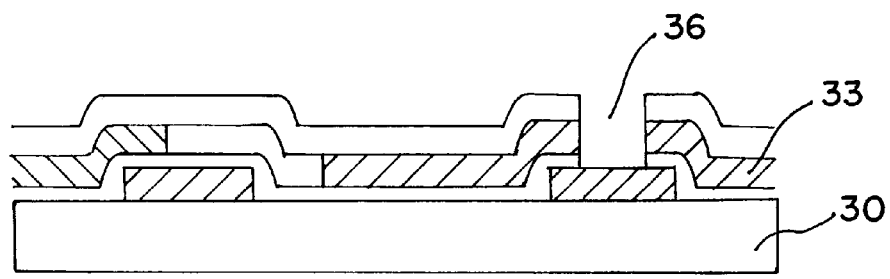
Figure 3G:
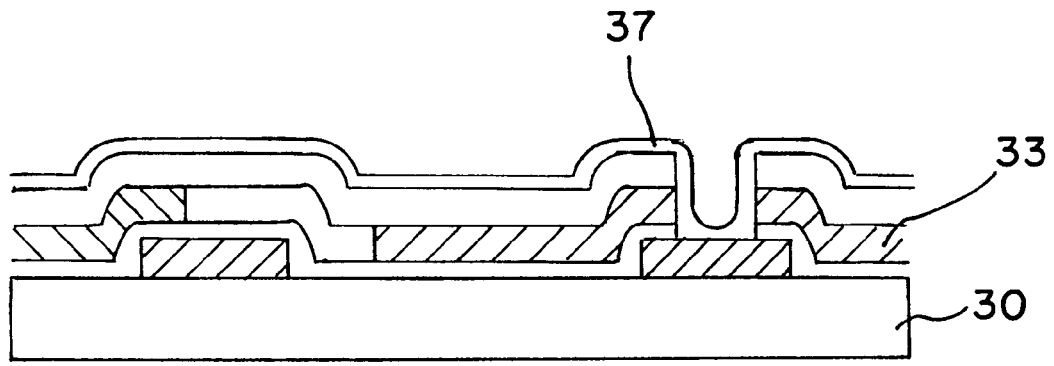
Figure 3H:
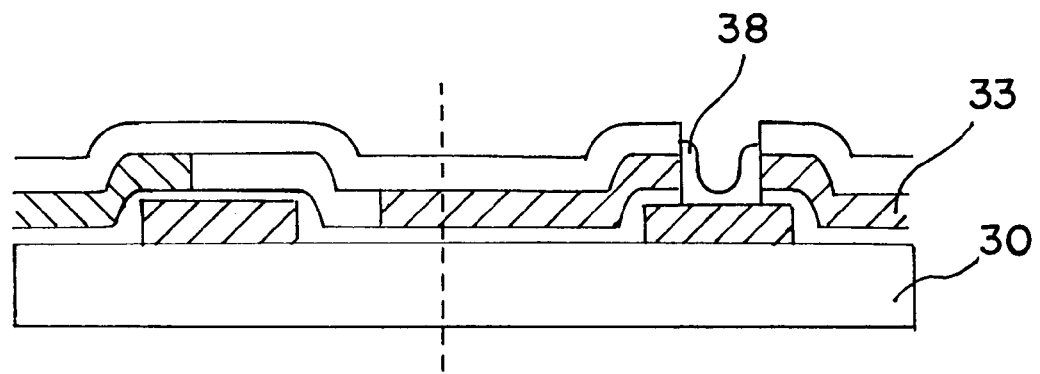

(6). Defining source 331, drain 332 and implant the phosphorus ion (1E 14~1E 16/cm2) to form the P+ region (Poly4), as shown in FIG. 3C.

(7).Growth of 100A~500A dioxide layer onto poly-crystal silicon thin-film as the isolation layer. (Please refer to FIG. 3D)

(8). Defining the contact window 36 within poly-crystal silicon layer from above isolation layer. (Please refer to FIG. 3E and FIG. 3F)

(9). To deposit Ti/TiN layer 37 by physical evaporating method. (Please refer to FIG. 3G)

(10). By the high temperature and quick speed annealing technology with the range from 750° C.~800° C., a Ti Silicide 38 will formed in contact window of Ti/TiN layer. With the reason that the thickness of gate only around 200A~500A, just by the proper temperature could make a connection of Poly3 and Poly4, meanwhile, Ti/TiN cannot become to Ti Silicide owing to the isolation from dioxide layer. (Please refer to FIG. 3H)

(11). Deposit a 6000A BPSG layer and put into a high temperature furnace to make its surface more flatness by the thermal flow.

(12). Metal deposition and connect to contact pad.

(13). Passivation and 410°C. alloy.

(14). Electric characteristics measurement.

Comparing to conventional process, the present invention uses a new contact technology by Ti Silicide with the following advantages and effects.

(1). It could avoid the damage to gate dioxide, and improve the Poly-Si/Sio2 interface quality. Owing to the decreasing of interface states, this could effectively drop the leakage current to decrease the power consumption, and meantime, could meet the demands of component integration.

(2). This new process could avoid the PN junction diode formed within the poly-crystal silicon layer, also decrease the voltage drop to improve the influence of contact voltage drop.

(3).This new process has the advantages that it not only does not add more process complexity and mask number, but also could improve the device characteristics without additional cost to meet marketing needs.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A contact process for interconnecting poly-crystal silicon layers in a thin-film SCRAM, the process comprising the steps of:

depositing N+ poly-crystal silicon;

growing a gate dioxide layer;

depositing a poly-crystal silicon thin-film layer;

growing a dioxide layer;

defining a contact window;

depositing a Ti/TiN layer;

high speed and high temperature annealing to selectively form Ti Silicide;

removing the Ti/TiN layers which fails to become Ti Silicide; and forming an interconnection contact of poly-crystal silicon.

2. The process for interconnecting poly-crystal silicon layers as claimed in claim 1, further comprising the step of using thermal oxidation or chemical deposition to form the dioxide layer in a channel layer.

3. The process for interconnecting poly-crystal silicon layers as claimed in claim 1, further comprising the step of using physical or chemical etching to form the interconnection of the poly-crystal silicon layers.

4. The process for interconnecting poly-crystal silicon layers as claimed in claim 1, wherein the Ti/TiN layer is formed by physical deposition.

5. The process for interconnecting poly-crystal silicon layers as claimed in claim 1, wherein a temperature range for annealing is from 750° C.–800° C.

6. The process for interconnecting poly-crystal silicon layers as claimed in claim 1, further comprising the step of using the interconnected layers in an electronic device.

* * * * *